(12) United States Patent
Spanoudaki et al.

(10) Patent No.: US 11,768,262 B2
(45) Date of Patent: Sep. 26, 2023

(54) INTERFACE RESPONSIVE TO TWO OR MORE SENSOR MODALITIES

(71) Applicant: Massachusetts Institute of Technology, Cambridge, MA (US)

(72) Inventors: Virginia Spanoudaki, Cambridge, MA (US); Aviad Hai, Boston, MA (US); Alan Pradip Jasanoff, Belmont, MA (US); Daniel G. Anderson, Framingham, MA (US); Robert S. Langer, Newton, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 867 days.

(21) Appl. No.: 16/818,588

(22) Filed: Mar. 13, 2020

(65) Prior Publication Data
US 2020/0292646 A1    Sep. 17, 2020

Related U.S. Application Data

(60) Provisional application No. 62/818,361, filed on Mar. 14, 2019.

(51) Int. Cl.
*G01R 33/36* (2006.01)
*H01L 29/06* (2006.01)
*H01L 27/088* (2006.01)

(52) U.S. Cl.
CPC .......... *G01R 33/36* (2013.01); *H01L 29/0673* (2013.01); *H01L 27/0886* (2013.01)

(58) Field of Classification Search
CPC .............. G01R 33/36; G01R 33/34053; G01R 33/4808; H01L 29/0673; H01L 27/0886; G01S 15/899
See application file for complete search history.

(56) References Cited

U.S. PATENT DOCUMENTS 3,452,256 A    6/1969    Clarke
3,453,507 A    7/1969    Archer
(Continued)

FOREIGN PATENT DOCUMENTS

WO    WO 2008/153552 A1    12/2008
WO    WO 2014/058473 A1    4/2014
(Continued)

OTHER PUBLICATIONS

Foxe et al., "Detection of Ionizing Radiation Using Graphene Field Effect Transistors;" Proceedings of the IEEE; Manuscript Received Nov. 13, 2009; 6 Pages.
(Continued)

*Primary Examiner* — Daniel Pihulic
(74) *Attorney, Agent, or Firm* — DALY, CROWLEY, MOFFORD & DURKEE LLP

(57) ABSTRACT

A cross-modal interface includes a multi-modal sensor configured to concurrently receive multiple input signals with each input signal being provided from a different imaging modality and in response thereto providing a single cross-modal output signal to processing circuitry which processes the single cross-modal output signal provided thereto and generates an output comprising information obtained or otherwise derived from each of or a combination of the different imaging modalities.

20 Claims, 10 Drawing Sheets

(56) References Cited

U.S. PATENT DOCUMENTS

| | | | |
|---|---|---|---|
| 4,636,825 | A | 1/1987 | Baynes |
| 5,262,649 | A | 11/1993 | Antonuk et al. |
| 5,273,910 | A | 12/1993 | Tran et al. |
| 6,859,232 | B1 | 2/2005 | Tonami et al. |
| 7,129,554 | B2 | 10/2006 | Lieber et al. |
| 7,923,240 | B2 | 4/2011 | Su |
| 8,097,926 | B2 | 1/2012 | de Graff et al. |
| 8,110,883 | B2 | 2/2012 | Ward et al. |
| 8,372,726 | B2 | 2/2013 | de Graff et al. |
| 8,389,862 | B2 | 3/2013 | Arora et al. |
| 8,426,208 | B2 | 4/2013 | Swager et al. |
| 8,536,667 | B2 | 9/2013 | de Graff et al. |
| 8,886,334 | B2 | 11/2014 | Ghaffari et al. |
| 8,889,455 | B2 | 11/2014 | Duane et al. |
| 8,951,473 | B2 | 2/2015 | Wang et al. |
| 9,972,649 | B2 * | 5/2018 | Spanoudaki ........ H01L 29/0669 |
| 2009/0014757 | A1 | 1/2009 | Takulapalli et al. |
| 2010/0087782 | A1 | 4/2010 | Ghaffari et al. |
| 2010/0297608 | A1 | 11/2010 | Stern et al. |
| 2010/0330687 | A1 | 12/2010 | Afzali-Ardakani et al. |
| 2011/0215931 | A1 | 9/2011 | Callsen et al. |
| 2011/0218756 | A1 | 9/2011 | Callsen et al. |
| 2011/0218757 | A1 | 9/2011 | Callsen et al. |
| 2012/0028820 | A1 | 2/2012 | Rhodes et al. |
| 2012/0065937 | A1 | 3/2012 | de Graff et al. |
| 2012/0092178 | A1 | 4/2012 | Callsen et al. |
| 2012/0156833 | A1 | 6/2012 | Kawashima et al. |
| 2012/0244848 | A1 | 9/2012 | Ghaffari et al. |
| 2013/0099358 | A1 | 4/2013 | Elolampi et al. |
| 2013/0150693 | A1 | 6/2013 | D'Angelo et al. |
| 2013/0185003 | A1 | 7/2013 | Carbeck et al. |
| 2013/0192356 | A1 | 8/2013 | de Graff et al. |
| 2013/0200268 | A1 | 8/2013 | Rafferty et al. |
| 2013/0225965 | A1 | 8/2013 | Ghaffari et al. |
| 2013/0245388 | A1 | 9/2013 | Rafferty et al. |
| 2013/0274562 | A1 | 10/2013 | Ghaffari et al. |
| 2013/0313713 | A1 | 11/2013 | Arora et al. |
| 2013/0316487 | A1 | 11/2013 | de Graff et al. |
| 2013/0337567 | A1 | 12/2013 | Shin et al. |
| 2014/0001058 | A1 | 1/2014 | Ghaffari et al. |
| 2014/0012160 | A1 | 1/2014 | Ghaffari et al. |
| 2014/0012242 | A1 | 1/2014 | Lee et al. |
| 2014/0022746 | A1 | 1/2014 | Hsu |
| 2014/0034907 | A1 | 2/2014 | Lee et al. |
| 2014/0039290 | A1 | 2/2014 | de Graff et al. |
| 2014/0097944 | A1 | 4/2014 | Fastert et al. |
| 2014/0110859 | A1 | 4/2014 | Rafferty et al. |
| 2014/0188426 | A1 | 7/2014 | Fastert et al. |
| 2014/0232841 | A1 | 8/2014 | Ohta et al. |
| 2014/0240932 | A1 | 8/2014 | Hsu |
| 2014/0249520 | A1 | 9/2014 | Ghaffari et al. |
| 2014/0303452 | A1 | 10/2014 | Ghaffari et al. |
| 2014/0340857 | A1 | 11/2014 | Hsu et al. |
| 2014/0375465 | A1 | 12/2014 | Fenuccio et al. |
| 2015/0019135 | A1 | 1/2015 | Kacyvenski et al. |
| 2015/0034834 | A1 | 2/2015 | Afzali-Ardakani et al. |
| 2015/0035680 | A1 | 2/2015 | Li et al. |
| 2016/0041155 | A1 | 2/2016 | Takulapalli |
| 2020/0292646 | A1 * | 9/2020 | Spanoudaki ........... G01R 33/36 |

FOREIGN PATENT DOCUMENTS

| | | |
|---|---|---|
| WO | WO 2014/059032 A1 | 4/2014 |
| WO | WO 2014/110176 A1 | 7/2014 |
| WO | WO 2014/130928 A2 | 8/2014 |
| WO | WO 2014/130931 A1 | 8/2014 |
| WO | WO 2014/186467 A2 | 11/2014 |
| WO | WO 2014/197443 A1 | 12/2014 |
| WO | WO 2014/205434 A2 | 12/2014 |
| WO | WO 2015/021039 A1 | 2/2015 |

OTHER PUBLICATIONS

Gandhi et al., "Cadmium Zinc Telluride (CZI) Nanowire Sensors for Detection of Low Energy Gamma-Ray Detection;" Micro (MEMS) and Nanotechnologies for Space, Defense, and Security II; Proceedings of SPIE, vol. 6959, 695904-1; 2008; 13 Pages.

Hayden et al., "Nanoscale Avalanche Photodiodes for Highly Sensitive and Spatially Resolved Photon Detection;" Nature Materials, vol. 5; May 2006; 5 Pages.

Lobez et al., "Radiation Detection: Resistivity Responses in Functional Poly(Olefin Sulfone)/Carbon Nanotube Composites;" Angewandte Chemie International Edition 2010, vol. 49; Jan. 4, 2010; pp. 95-98; 4 Pages.

Romeo et al., "Nanowire-based Field Effect Transistors for Terahertz Detection and Imaging Systems;" *Nanotechnology*, vol. 24, No. 21; Apr. 25, 2013; 8 Pages.

Stern et al., "Label-free Immunodetection with CMOS-Compatible Semiconducting Nanowires;" Nature, www.nature.com/nature, vol. 445; Feb. 1, 2007; 4 Pages.

Stern et al., "Supplementary Information: Label-Free Immunodetection with CMOS-Compatible Semiconducting Nanowires;" Nature, www.nature.com/nature; vol. 445; Feb. 1, 2007; 18 Pages.

Tang et al., "Measurement of Ionizing Radiation Using Carbon Nanotube Field Effect Transistor;" Physics in Medicine and Biology, vol. 50; Feb. 7, 2005; pp. N23-N31; 9 Pages.

Spanoudaki, "Towards Small Scale Integration of Imaging Technologies (MIT/Harvard);" PowerPoint Presentation; Presented Apr. 9, 2015; 3 Pages.

PCT International Search Report and Written Opinion dated Jan. 17, 2017 for International Application No. PCT/US2016/057275; 15 pages.

Tang et al., "Measurement of Ionizing Radiation using Carbon Nanotube Field Effect Transistor;" Institute of Physics Publishing, Physics in Medicine and Biology; vol. 50; Jan. 19, 2005; 9 pages.

Cui et al., "High Performance Silicon Nanowire Field Effect Transistors;" Nano Letters, vol. 3, No. 2; Nov. 1, 2002; 4 pages.

Kuo, "Thin Film Transistor Technology—Past, Present, and Future;" The Electrochemical Society Interface; Jun. 20, 2013; 7 pages.

Wang et al., "Opportunities and Challenges in Application-Tuned Circuits and Architectures Based on Nanodevices;" ACM First Conference on Computing Frontiers, vol. CF'04; Apr. 16, 2004; 9 pages.

Takahashi et al., "Carbon Nanotube Active-Matrix Backplanes for Mechanically Flexible Visible Light and X-ray Imagers;" Nano Letters, vol. 13, No. 11; Nov. 13, 2013; 6 pages.

* cited by examiner

INTERFACE RESPONSIVE TO TWO OR MORE SENSOR MODALITIES

CROSS REFERENCE TO RELATED APPLICATIONS

This application claims the benefit of U.S. Provisional Application No. 62/818,361, filed on Mar. 14, 2019 under 35 U.S.C. § 119(e) which application is hereby incorporated herein by reference in its entirety.

STATEMENT REGARDING FEDERALLY SPONSORED RESEARCH

Not applicable.

FIELD OF THE INVENTION

This disclosure relates generally to an interface and, more particularly, to an interface configured to be responsive to two or more different sensor modalities (i.e. a cross-modal interface).

BACKGROUND

As is known in the art, in modern medicine, imaging is used as a diagnostic tool for the detection of structural, functional or biochemical changes in patients in a non-invasive manner. In basic research, imaging plays an important role in better understanding disease and in discovering new therapies. Imaging modalities such as microscopy, optical imaging (fluorescence, bioluminescence), x-ray tomography, radionuclide imaging (radiography, positron emission topography ("PET"), single-photon emission computed tomography ("SPECT")), magnetic resonance imaging ("MRI"), and ultrasound imaging are employed as diagnostic tools.

As is also known, the combination of two or more imaging modalities ("multi-modal imaging") may be used to extract more detailed information for diagnostic purposes when compared to single modality systems That is, each modality in its current technological state can provide detailed information about a specific aspect of an object being studied (for example, a malignant tumor). Present single modality systems, however, fail to provide information about many different aspects of the object being studied at the same time. For example, positron emission tomography (PET) will give a great deal of information about the metabolism of a tumor, while computed tomography (CT) will locate the tumor in the anatomical map of a patient and magnetic resonance imaging (MRI), will provide information about soft tissue contrast or other physiological aspects such as oxygenation, pH, etc., of the tumor. Further still, ultrasound can be used to assess tumor vascularity, tissue consistency and so on.

The manner in which information derived from a single modality is interpreted, however, can be significantly affected by complementary information provided from other, different modalities, simply because other modalities can provide different information on the same object (e.g. a tumor) that can be spatially and temporally correlated.

For example, one trend in modern hospitals is to replace standalone PET scanners with PET/CT scanners. This is because the diagnostic value that a CT scanner can add to a PET scanner has been shown to be very significant. For example, PET can be used to map energy consumption of malignant tumors and CT or MRI can identify the position of these tumors in the anatomical background of a patient. Thus, it is generally known multi-modal imaging systems and techniques yield a higher information content than single modality systems and techniques. Such higher information content can be used to more accurately characterize disease and personalize care.

SUMMARY

In accordance with the concepts, systems and techniques described herein, however, it has been recognized that current multimodal imaging systems allow each modality to operate either serially (i.e. one imaging session is performed after the other) or synchronously (i.e. both imaging sessions are performed simultaneously), depending on whether the imaging hardware of each modality is completely separate or has undergone some level of integration. In either case, images corresponding to each modality are reconstructed from separate data and signal streams and are co-registered with respect to each other producing a single image with two types of information. The level of temporal or spatial correlation between the information on the two images depends on the level of integration between the two modalities and the accuracy of co-registration. It would, therefore, be desirable to provide a single system capable of concurrently receiving input signals from multiple, different imaging modalities and providing a single output comprising pieces of information from each of the different imaging modalities. Such imaging modalities may be, for example, different photon-based techniques and/or different proton-based techniques and/or a combination of photon-based and proton-based techniques.

According to the concepts, systems and techniques described herein, a cross-modal interface (also sometimes referred to herein as a cross-modal sensor) includes a multi-modal sensor configured to concurrently receive multiple input signals with each input signal being provided from a different imaging modality and in response thereto providing a single output signal (sometime referred to herein as "a cross-modal output signal" or more simply "a cross-modal signal") to processing circuitry which processes the signal provided thereto and generates an output comprising information obtained or otherwise derived from each of (or a combination of) the different imaging modalities.

With this particular arrangement, a cross-modal interface capable of generating a single data/signal stream to produce/construct an image which includes information from a plurality of different imaging modalities is provided. Since the cross-modal interface image is constructed from a single data signal (i.e. a single signal made from two separate sensor signals, rather than from separate data signals) it is not necessary to co-register data from different data/signal streams to produce a single image comprising two types of information. Thus, the cross-modal interface described herein generates an image having a level of temporal and/or spatial correlation between information provided from the different imaging modalities which is not dependent upon the ability to accurately register/correlate separate data streams.

In embodiments, the cross-modal interface includes at least one sensor having source, drain and gate terminals provided on a substrate with a radiation sensitive material disposed over portions thereof and coupled to at least one of the source, drain and gate terminals. The sensor can be responsive to a first input associated with a first imaging modality received at the gate terminal and a second input associated with a second imaging modality applied to the radiation sensitive material. The sensor is configured such that so that the conductivity between the source and drain terminals changes in response to the first and second inputs and the sensor generates a single output signal (i.e. a combined modality signal) representative of the first input associated with the first imaging modality and the second input associated with the second modality.

In embodiments, the cross-modal interface includes at least one sensor having source and drain terminals, a frontside gate terminal, and a backside gate terminal. The sensor can be responsive to a first input associated with a first imaging modality received at the front side terminal and a second input associated with a second imaging modality received at the backside terminal. The sensor can be further configured so that the conductivity between the source and drain terminals changes in response to the first input associated with the first imaging modality received at the frontside gate and the second input associated with the second imaging modality received at the backside gate. Also, the sensor can be configured to generate a combined modality signal representative of the first input associated with the first imaging modality received at the frontside gate and the second input associated with the second modality received at the backside gate.

With such arrangements, benefits of a cross-modal interface are achieved. The cross-modal interface receives a plurality of input signals from different modalities and in response thereto generates a single output signal having data characterized by real-time correlation between the information from each different sensor modality. This allows a single output signal (e.g. a single data stream) to be provided to a processor (e.g. a microprocessor, a digital signal processor or any other type of processing element) for further processing (e.g. application of a model provided from a deep learning algorithm). Furthermore, since a single output signal characterized by real-time correlation between the information of each signal modality is used, the cross-modal interface may be implemented with simplified associated electronics. It should be appreciated that the single output signal can be processed to either extract information specific to each modality (for example, a single signal stream can produce two images), or to add information content from one modality to the other (for example, a single signal stream can be used to produce a single image which includes information from both PET imaging and x-ray imaging).

Features may include one or more of the following individually or in combination with other features. The cross-modal interface can include signal processing circuitry coupled to sensor source or drain terminals so as to receive the combined modality signal.

In embodiments, a training data set comprised of a collection of cross-modal signals (ideally, a large collection of cross-modal signals) is generated. Detailed information is known apriori about the signals (i.e. signal characteristics) of each modality which make up each of the cross-modal signals in the training data set. The training data set is then used to train a learning algorithm to "learn" how to derive the first and second modality signal from any arbitrary cross-modal signal. The cross-modal interface thus also includes (or may be coupled to) a processor which processes signals provided thereto in accordance with the learned training data set and generates information associated with the multiple signals of different modalities detected by the sensor.

In embodiments, the cross-modal interface can include a voltage source configured to provide a voltage to at least one of a frontside gate terminal and a backside gate terminal.

Also described is a method for cross-modal signal generation. The method includes receiving, at a frontside gate terminal of a sensor a first input associated with a first imaging modality and, at a backside gate terminal of the sensor, receiving a second input associated with a second imaging modality. The method can also include generating an output signal representative of the first input associated with the first imaging modality received at the frontside gate and the second input associated with the second imaging modality received at the backside gate.

In one embodiment, for the first modality the "gating" occurs via the absorption of a radiation involved with this modality by a radiation sensitive material as described in U.S. Pat. No. 9,972,649 entitled "NANOWIRE FET IMAGING SYSTEM AND RELATED TECHNIQUES" assigned to the assignee of the present application and incorporated herein by reference in its entirety.

For the second modality the "gating" occurs by applying a bias signal (e.g. a voltage or current bias signal) to the back-side gate terminal. This voltage/current bias signal is generated by a detector element specific to the second modality (for example, a piezoelectric transducer for an ultrasound modality or a coil for an MRI modality).

In embodiments, the detector element of the second modality is (ideally) fully integrated into the cross-modal interface. This may be accomplished, for example, using micro/nano-fabrication techniques (which techniques may be the same as or similar to the techniques used to integrate the detector element of the first modality). However, for versatility and adaptability of the interface to imaging systems from different manufacturers, keeping the detector of the second modality completely separate may also be desirable in some embodiments.

In embodiments, the method can further include demodulating the output signal into an image representative of the first input associated with the first imaging modality and the second input associated with second imaging modality. Also, in embodiments, generating an output signal representative of the first input associated with the first imaging modality received at the frontside gate and the second input associated with the second imaging modality received at the backside gate can include modulating a current between a source terminal and a drain terminal of the sensor according to the first input associated with a first imaging modality received at the frontside gate terminal of the sensor and the second input associated with the second imaging modality received at the backside gate terminal of the sensor.

In embodiments, the method can include generating, at the frontside gate terminal of the sensor, a signal representative of the first input associated with the first imaging modality. In embodiments, the sensor may include a nanowire FET.

In embodiments, the first input can include a radiation associated with the first imaging modality and the second input can include a voltage associated with the second imaging modality.

According to a further aspect of the concepts, systems and techniques described herein, a cross-modal interface for one or more imaging modalities includes at least one sensor provided from a plurality of field effect transistors (FETs), each of the FETs having source and drain terminals and at least one gate terminal and a radiation sensitive material disposed to be coupled to at least one of the FET terminals. The sensor can be responsive to a first input associated with a first imaging modality received at the at least one gate terminal and further responsive to a second input associated with a second imaging modality received at the radiation sensitive material. The sensor can be configured so that the conductivity between the source and drain terminals changes in response to either the first input associated with the first imaging modality or the second input associated with the second imaging modality. In response to the plurality of input signals provided thereto, the sensor generates a single output signal corresponding to a combined modality signal representative of the first input associated with the first imaging modality and the second input associated with the second modality. In embodiments, one or more of the plurality of FETs may be provided as a multi-gate FET (MuGFET) with signals from disparate imaging modalities being provided to the different gates of the MuGFET.

BRIEF DESCRIPTION OF THE DRAWINGS

The concepts, structures, and techniques sought to be protected herein may be more fully understood from the following detailed description of the drawings, in which.

It should be noted that the drawings are not necessarily to scale, or inclusive of all elements of a system, emphasis instead generally being placed upon illustrating the concepts, structures, and techniques sought to be protected herein.

DETAILED DESCRIPTION

Before describing the details of a cross-modal interface, it should be noted that the concepts described herein are generally directed toward a single sensor capable of concurrently receiving/detecting signals from the multiple different sensor modalities and providing an output (e.g. an image or other output information) from a single data stream (rather than from separate data streams) which includes information from the multiple, different sensor modalities. It should be appreciated that in embodiments, some or all of the inputs to the cross-modal interface may not originate from imaging modalities. Rather input signals to the cross-modal interface may be signals from chemical, biological or other types of sensors. Regardless of the origin of signals having the different sensor modalities, by concurrently detecting signals in a single sensor and providing an output as a single data stream, it is not necessary to co-register data from different data streams to produce a single output (e.g. a single image) including information from two different types of sensors. With this approach, the cross-modal interface described herein is capable of generating an output (e.g. an image) having a level of temporal and/or spatial correlation between information provided from different sensing modalities (e.g. different imaging modalities) which is not dependent upon the ability to accurately register/correlate separate data streams.

Figure 1:
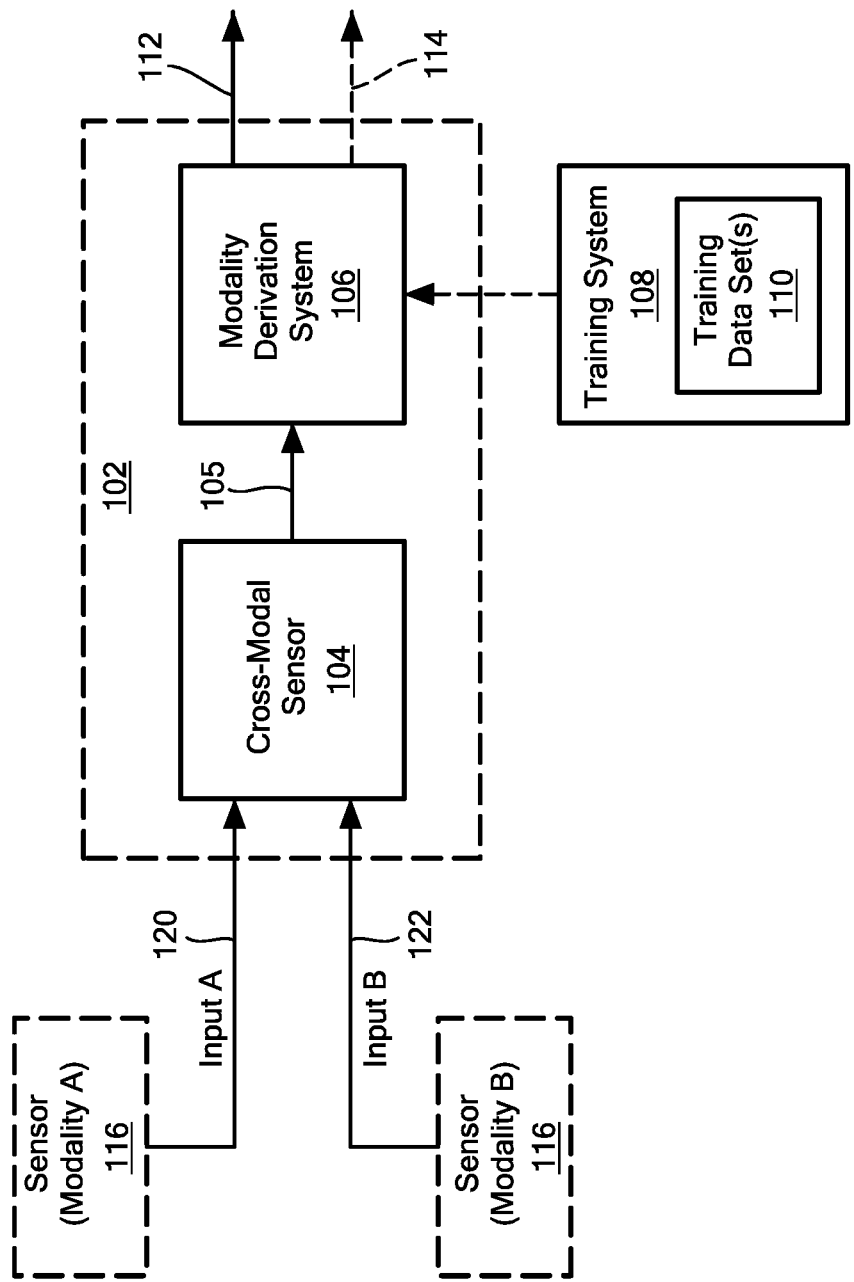
FIG. 1 is a block diagram of a cross-modal interface, according to some embodiments.

Referring now to FIG. 1, cross-modal interface 102 is configured to be responsive to two or more inputs 120, 122 provided from sensors 116, 118 having different sensor modalities. In response to the disparate sensor modality signals provided thereto, the cross-modal sensor 104 generates a single output signal 105. The output signal 105 is thus generated from a combination of inputs 120 and 122.

Inputs 120, 122 are generated by sensors 116, 118 which operate in accordance with different sensor modalities. For example, sensor A 116 may be provided as a first one of imaging sensor circuitry, biological sensor circuitry, chemical sensor circuitry, etc. . . . .while sensor B 118 may be provided as a second, different one of imaging sensor circuitry, biological sensor circuitry, chemical sensor circuitry, etc. . . . . In FIG. 1, the sensors are illustrated as operating in accordance with different sensor modalities (illustrated as modality A and modality B in FIG. 1). A sensor modality includes a type of input that a respective sensor circuitry is responsive to. For example, temperature modalities can include inputs that temperature sensors are responsive to (e.g. electrical signals, infrared, etc.), imaging modalities can include inputs to which imaging sensors are responsive (e.g. light, x-rays, gamma rays, magnetic fields (such as from magnetic imaging resonance ("MRI")), electrical signals, etc.), and position modalities can include inputs that position sensors are responsive to (electrical signals, magnetic fields, lasers, etc). An input associated with a sensor modality can include the type of input that a respective sensor circuitry is responsive to, the output of a sensing circuitry responsive to a respective sensor modality, or both.

In embodiments, inputs 120, 122 may be associated with different types of inputs of similar sensor modalities. For example, input 120 may be associated with x-rays (an imaging modality) and input 122 may be associated with magnetic fields (also an imaging modality). In various embodiments, inputs 120, 122 may, of course, be configured to accept non-imaging modalities. For example, a first input (e.g. input 120) can be an imaging signal such as x-ray and a second input (e.g. input 122) can be a current/voltage output of a chemical or biological sensor that measures a quantity in the blood.

Cross-modal interface 102 includes cross-modal sensor 104 and modality derivation system 106. In embodiments, sensors 116, 118 may be provided as part of or be integrated with cross-modal interface 102 and more particularly with cross-modal sensor 104. Cross-modal sensor 104 may include analog/digital sensing circuitry. Such circuitry may include, but is not limited to, temperature sensing circuitry, position sensing circuitry, imaging circuitry, angle sensing circuitry, chemical sensing circuitry, biological sensing circuitry or any combination thereof.

In embodiments, cross-modal sensor 104 includes one or more inputs configured to concurrently receive at least two inputs 120, 122 associated with different sensor modalities. As will become apparent from the description herein below, each input is further configured to generate a signal representative of the respective received inputs. For example, in the illustrative embodiment of FIG. 1, cross-modal sensor 104 can include a first input that receives input A 120. The first input is configured to be responsive to input A 120 and to generate a signal representative of input A 120. Further, cross-modal sensor 104 can include a second input that receives input B 122. The second input is configured to be responsive to input B 122 to generate a signal representative of input B 122.

Sensor 104 is configured to concurrently receive multiple inputs associated with different sensor modalities and generate a single output signal 105 referred to herein as a combined modality signal having signal characteristics from each of the multiple inputs. Inputs 120, 122 modulate the output signal to generate the combined modality signal 105. In embodiments, the output signal may correspond to a current signal. In alternate embodiments, the output signal may correspond to an output voltage signal.

In embodiments, the cross-modal signal 105 corresponds to a signal between the source and the drain of a field effect transistor (FET) provided as part of the cross-modal interface. Such a cross-modal signal may be modulated by any or all of: (1) radiation absorbed at radiation sensitive material provided as part of sensor 104 (modality 1); (2) a voltage at a top-side (or front-side) gate terminal (modality 2 or power supply); and/or (3) a voltage at a back-side gate terminal (modality 2 or power supply or modality 3). It should be noted that each one of these modulation sources might have different time/amplitude/intensity characteristics.

The cross-modal signal 105 is provided to a modality derivation system 106. Modality derivation system 106 may include signal processing circuitry to de-noise, amplify and digitize the cross-modal signal and also processes the cross-modal signal.

In some embodiments, modality derivation system 106 may process the cross-modal signal 105 and provide one signal 112 representative of the two or more inputs 120, 122 while in other embodiments, modality derivation system 106 is configured to process cross-modal signal into two or more signals 112, 114 representative of the two or more inputs 120, 122. Thus, the number of outputs provided by modality derivation system 106 may correspond to the number of inputs provided to sensor 104. Modality derivation system 106 may include, but is not limited to, a computer, a digital signal processor ("DSP"), a microcontroller, or any combination thereof.

As will be described in detail further below, modality derivation system 106 utilizes a "trained model" to process the input signal provided thereto. A "trained model" is a model that has been trained on one or more training data sets 110 via a training system 108. A modeling methodology and, thus, a model may be implemented using an algorithm or other suitable processing sometimes referred to as "a learning algorithm," "a deep learning algorithm," "a machine learning algorithm," or "an algorithmic model." It should be understood that a model/methodology could be implemented using hardware, software, or a combination thereof. Thus, modality derivation system 106 may be provided as a processing device which applies a trained model (e.g. a model generated via a learning algorithm) to a signal provided to an input thereof from the cross-modal sensor 104. In this way, modality derivation system 106 infers individual modality signals from the cross-modal signal based upon prior knowledge with which the modality derivation system 106 has been trained (e.g. modality derivation system 106 infers individual modality signals via a deep learning algorithm executing on a processor of the modality derivation system).

It should also be appreciated that in some embodiments, all or portions of modality derivation system 106 may not be integrated with cross-modal sensor 104. That is, in some embodiments cross-modal sensor 104 and modality derivation system 106 are not provided as part of the same integrated circuit (IC). In some embodiment, modality derivation system 106 may not be provide as an IC, rather modality derivation system 106 may be provided as a separate processing system. In other embodiments, however, cross-modal sensor 104 and modality derivation system 106 may both be provided as ICs and may both be provided as part of the same IC.

As noted above, and as will be described below in detail in conjunction with FIG. 4, modality derivation system 106 interfaces with a training system 108 which includes a plurality of training data sets 110. Modality derivation system 106 and training system 108 can include a computer, a processor, a microprocessor, DSP, or any combination thereof coupled to memory. Memory can include a hard drive, flash memory, programmable read-only memory ("PROM"), erasable PROM, or any combination thereof.

Existing multimodal systems either have no level of integration or a level of integration limited to placing two imaging systems within the same enclosure so that they share the same filed-of-view. In the latter case, special consideration is taken to minimize interference in the operation of one modality from the signals of the other. One example is PET/MRI, where the alternate magnetic fields of MRI can interfere with photodetectors and associated electronics in PET. Currently this interference is mitigated by proper shielding of the PET electronics and detectors, thus adding to both the design complexity and the cost of the system.

The cross-modal interface 102 provides an integrative approach to multimodal imaging by allowing the detection of signals from a first modality 120 to be modulated by signals from another modality 122.

In embodiments, a high-throughput, nanoscale fabrication of the cross-modal interface 102 may provide a platform for full integration of a true multi-modal detector on a single chip. For example, one of the gates of the cross-modal interface 102 can either accept the signal generated by a separate, stand-alone detector, or be directly connected to a nano/micro fabricated detector (i.e. a micro-coil for MRI or a piezoelectric nanowire for US) fully integrated in the same substrate.

The cross-modal interface can find applicability in the medical imaging industry. Specifically, the cross-modal interface 102 can be used in optical, ultrasound, magnetic resonance, x-ray, and radionuclide-based imaging systems. The cross-modal interface 102 can be appropriate for use in image guided intervention procedures such as biopsy and surgery. Other applications include but are not limited to: high energy physics detectors and homeland security applications, aviation applications, space applications, as well as applications utilizing biological and chemical sensing and medical diagnostics.

FIGS. 2A-2D illustrate multiple configurations of a cross-modal sensor. Such cross-modal sensors may be the same or similar to cross-modal sensor 104 described above in conjunction with FIG. 1. It should be noted that like elements of FIGS. 2A-2D are provided having like reference designations throughout the several views.

In each configuration, a cross-modal sensor includes source and drain terminals 230, 232 and two gate terminals 226,228 (respectively identified in FIGS. 2A-2D as "Frontside Gate (Terminal 3)" and "Backside Gate (Terminal 4)"). Thus, in the illustrative embodiments (as will be described below), the cross-modal sensor includes physical terminals 226, 228, 230, 232 and input signals may be applied or otherwise provided to either or both of terminals 226, 228 while terminals 230, 232 serves as outputs.

The cross-modal sensor also includes radiation sensitive material 234 disposed over and coupled to at least some of terminals 226-232. It should be understood that in addition to receiving signals at one or both of inputs 226, 228, cross-modal sensor is also capable of receiving an input signal 220 via radiation sensitive material 234 (i.e. radiation sensitive material 234 may also act as an input of the cross-modal sensor. It should thus be appreciated that modulation of output signals may occur wirelessly through the absorption of radiation at the radiation sensitive material 234.

In embodiments, the cross-modal sensors described herein may be realized as the type described in U.S. Pat. No. 9,972,649 to Spanoudaki et al. entitled "Nanowire FET Imaging System and Related Techniques" comprising a nanowire field effect transistor ("NWFET"). The NWFET can be provided having a dual gate configuration (for example top-gate and bottom-gate) where one of the gates will alter the source-drain signal based on the radiation incident/dissipated/absorbed within its material (i.e. visible light, x-rays, gamma rays, electrons), while the other gate will further alter the source-drain signal when a voltage from a different imaging detector (i.e. a different imaging modality) is applied to it (e.g. signal from an MRI coil, or from a piezoelectric ultrasound transducer). The combined altered signal can subsequently be analyzed by signal processing algorithms and can either be decomposed to signals corresponding to each modality or be used to predict the individual contributions of each modality.

Figure 2A:
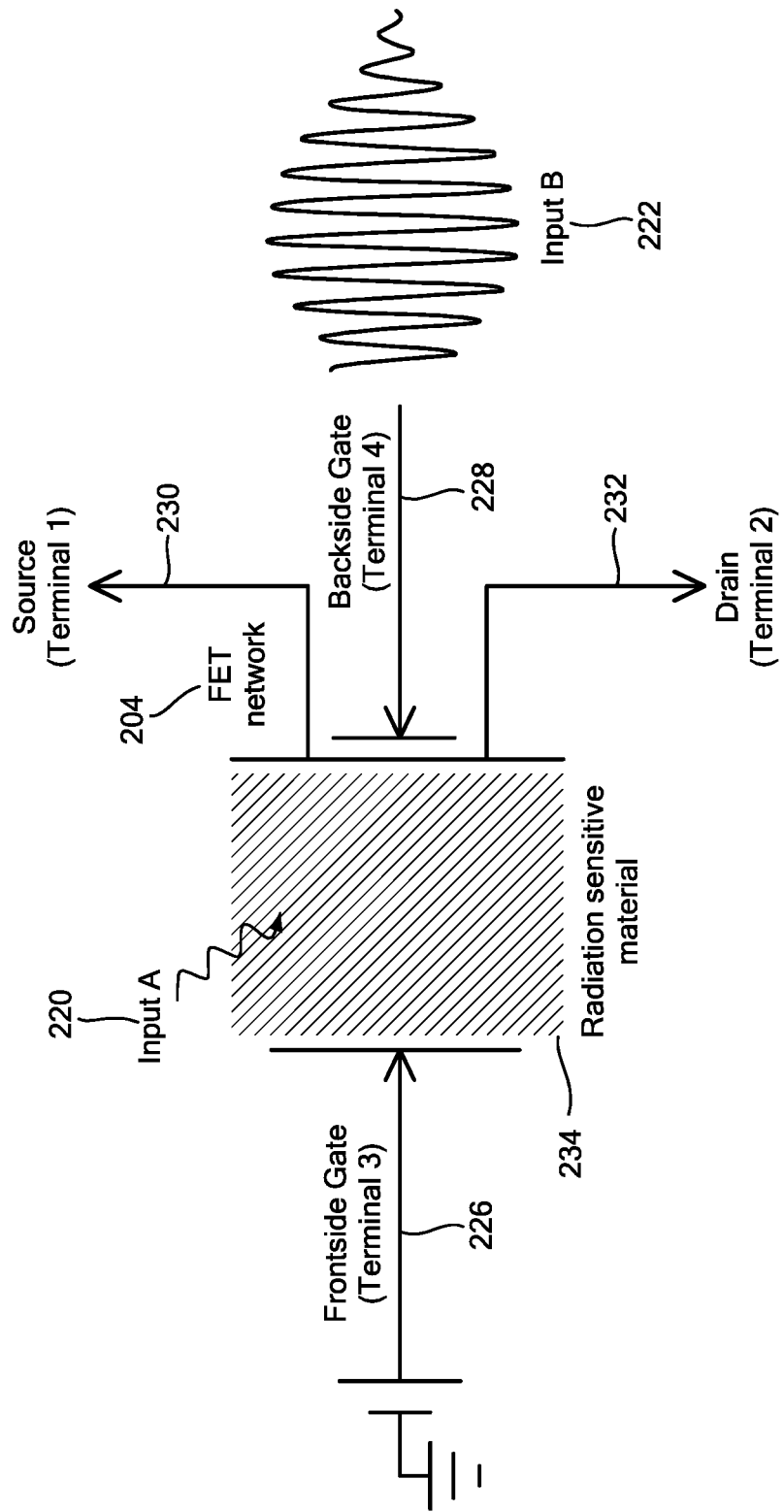
FIGS. 2A-D are a series of schematic diagrams illustrating several example configurations of cross-modal sensors.

Referring now to FIG. 2A, a cross-modal interface includes a network of FETs 204. To promote clarity in the figures and description, FET network 204 is illustrated in FIGS. 2A-2D as a single FET. FET network 204 may be used in a cross-modal sensor which maybe the same or similar to cross-modal sensor 104 of FIG. 1. FET network 204 can include one or more nMOSFETs, pMOSFETs, jMOSFETs, NWFETs and it should be appreciated that such NWFETs can be any of the different types of MOSFETs and that such NWFETs may be the same as or similar to the NWFETs described in U.S. Pat. No. 9,972,649 to Spanoudaki et al. entitled "Nanowire FET Imaging System and Related Techniques" which is hereby incorporated by reference in its entirety, or any combination thereof.

FET network 204 has two opposing surfaces (a "top surface" and a "bottom surface") and is configured to be responsive to a first input signal 220 associated with a first imaging modality and a second input 222 associated with a second imaging modality at a terminal 228. Thus, in the illustrative embodiment of FIG. 2A, the first input signal is received via radiation sensitive material 234 and the second input signal is received at backside gate 228. In response to the two input signals, an output signal (referred to herein as a "cross-modal output signal" or more simply as a "cross-modal signal") provided at outputs 230, 232 As will become apparent from the description hereinbelow, terminal 226 is configured to provide the option to further modulate the cross-modal signal by applying or otherwise providing a third input signal (e.g. a voltage or current signal) to terminal 226.

As noted above, the first input signal 220 may be generated via a first imaging modality. The first imaging modality can include, but is not limited to: light, x-rays, gamma rays, beta rays, infrared, or any combination thereof. The first input 220 thus corresponds to a radiation signal associated with the first imaging modality.

As noted above, in this illustrative embodiment, radiation sensitive material 234 is disposed over at least a portion of and capacitively coupled to the frontside gate 226 of FET 204. In the case where FET 204 is provided as an NWFET, due to the architecture of the NWFET the material 234 will be capacitively and resistively coupled to both the frontside and the backside gates. However, signals fed to terminals 226/228 could be inductively or acoustically coupled as well. In response to a signal incident thereon, the radiation sensitive material 234 generates a signal which modulates a signal (e.g. a current signal) propagating between terminals 230, 232.

In embodiments, a gate of FET 204 over which a radiation sensitive material 234 is disposed can be coupled to a DC supply voltage. A DC supply voltage may also be coupled to terminals 226, 230, 232, or 228.

As noted above, the backside gate 228 is configured to be responsive to a second input 222 associated with a second imaging modality. In FIG. 2A, a second imaging modality may correspond, for example, to magnetic resonance or ultrasound imaging modalities with the second input 222 corresponding to an AC voltage representative of a magnetic resonance or an ultrasound signal (such as an AC voltage generated by an MRI coil or ultrasound transducer, respectively). Thus, in the illustrative embodiment of FIG. 2A, the input 222 applied to the backside gate 228 of FET network 204 may correspond to an AC voltage representative of an output signal generated via a magnetic resonance or an ultrasound imaging modality.

In FIG. 2A, FET network 204 is further configured to output a signal corresponding to a current between the first terminal 230 (here, a source terminal) and the second terminal 232 (here, a drain terminal) of FET network 204. FET network 204 is configured to modulate the current between the first and second terminals 230, 232 as the conductivity between the first and second terminals changes in response to the first input 220 received via the radiation sensitive material 234 and the second input 222 received at the backside gate 228 so as to produce a combined modality signal. In other words, the current between the first and second terminals 230, 232 is modulated according to the absorption of radiation by the radiation sensitive material 234 and a DC or AC voltage provided to frontside gate 226 and the input 222 (e.g. an AC voltage) provided to backside gate 228, or any combination thereof.

Figure 2B:
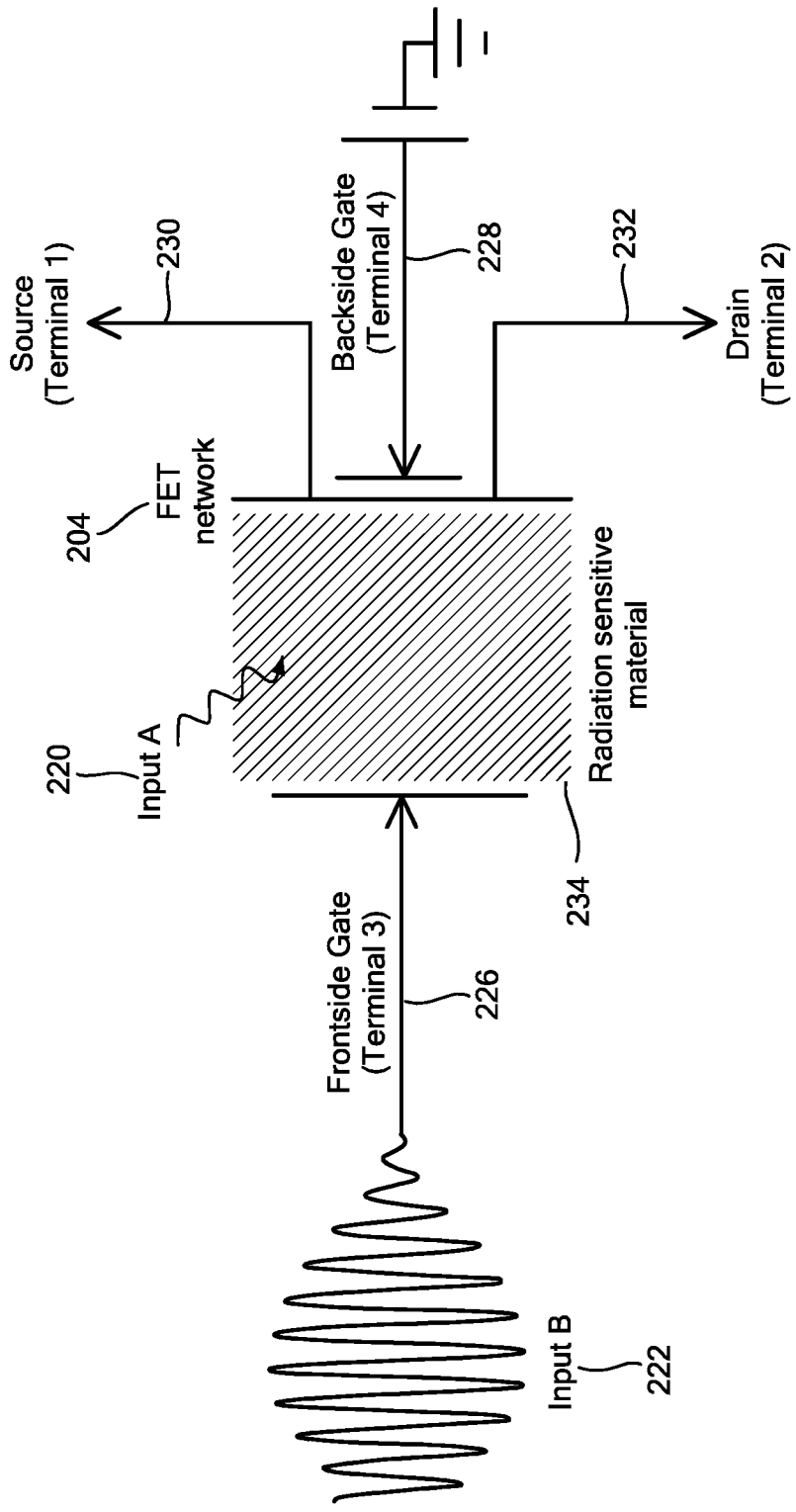

Referring now to the configuration illustrated in FIG. 2B, in this configuration, FET network 204 is configured to modulate the current between the first terminal 230 (source) and second terminal 232 (drain) of FET network 204 according to the absorption of radiation by the radiation sensitive material 234 (i.e. a first input signal resultant from a first imaging modality and applied to radiation sensitive material 234), the input 222 provided to the frontside gate 226 (e.g. a second input signal corresponding to an AC voltage generated via a second, different imaging modality), and an AC or DC voltage provided to the backside gate 228 or any combination thereof.

Figure 2C:
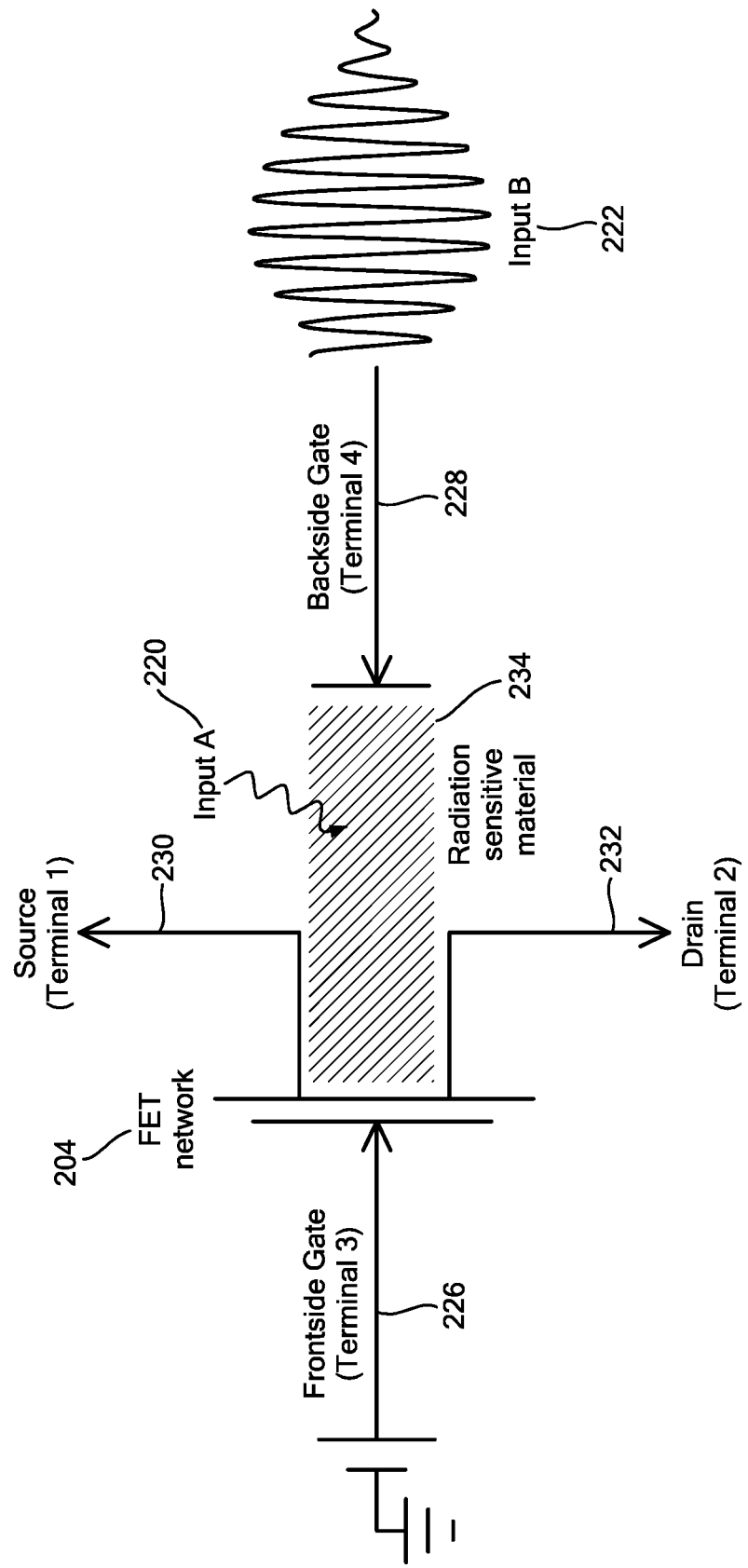

Referring now to the configuration illustrated in FIG. 2C, in this configuration, FET network 204 is configured to modulate the current between the first terminal 230 (source) and second terminal 232 (drain) of FET network 204 according to the absorption of radiation by the radiation sensitive material 234, an input signal applied to backside gate 228

(e.g. an AC input signal provided from an imaging modality), an AC or DC voltage provided to the frontside gate 226, or any combination thereof.

Figure 2D:
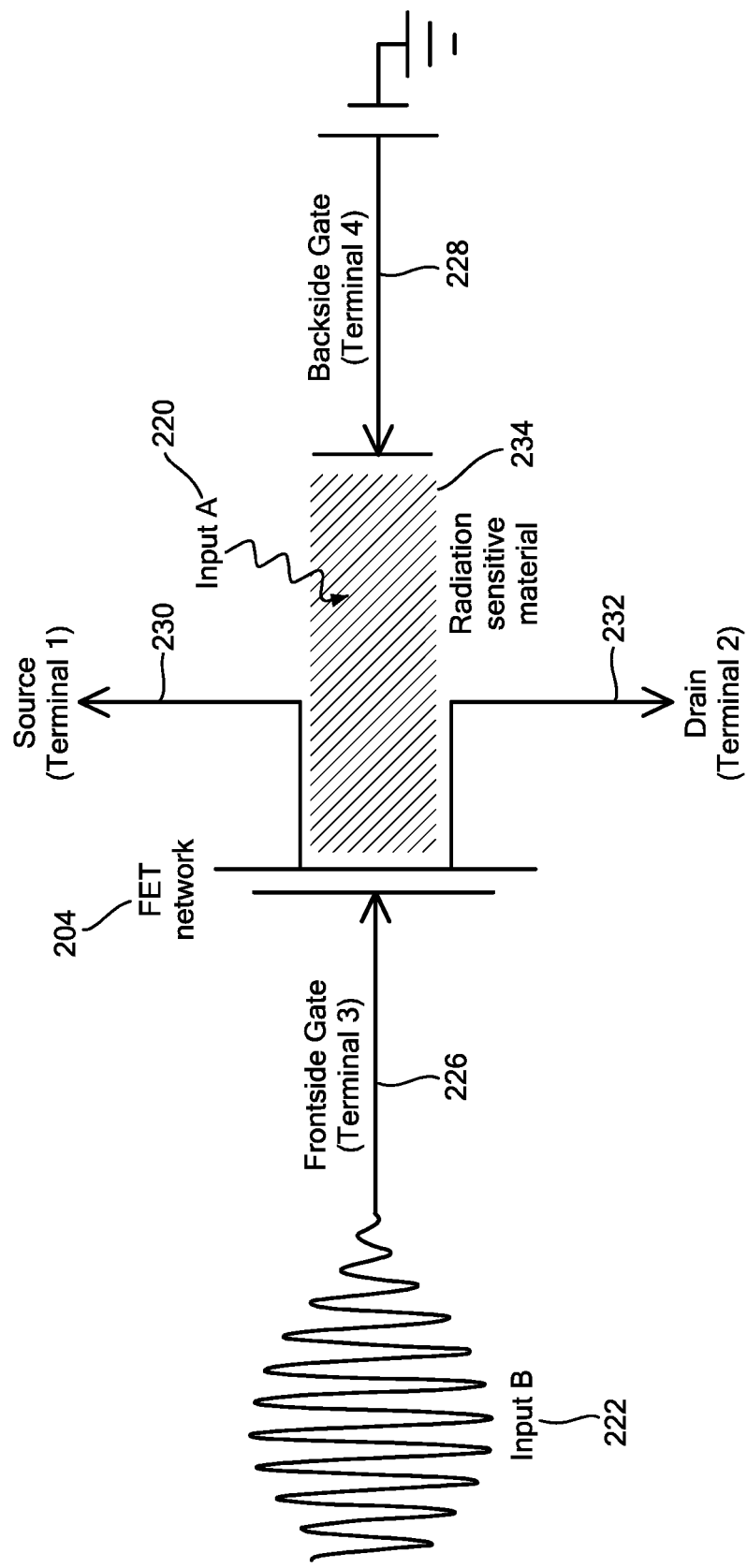

Referring now to the configuration illustrated in FIG. 2D, in this configuration, FET network 204 is configured to modulate the current between the first terminal 230 (source) and second terminal 232 (drain) of FET network 204 according to the absorption of radiation by the radiation sensitive material 234 (i.e. a first imaging modality signal applied to radiation sensitive material 234), the input 222 provided to the frontside gate 226 (e.g. a second input signal corresponding to an AC voltage signal generated by a second, different imaging modality), an AC or DC voltage provided to the backside gate 228, or any combination thereof.

Figure 3:
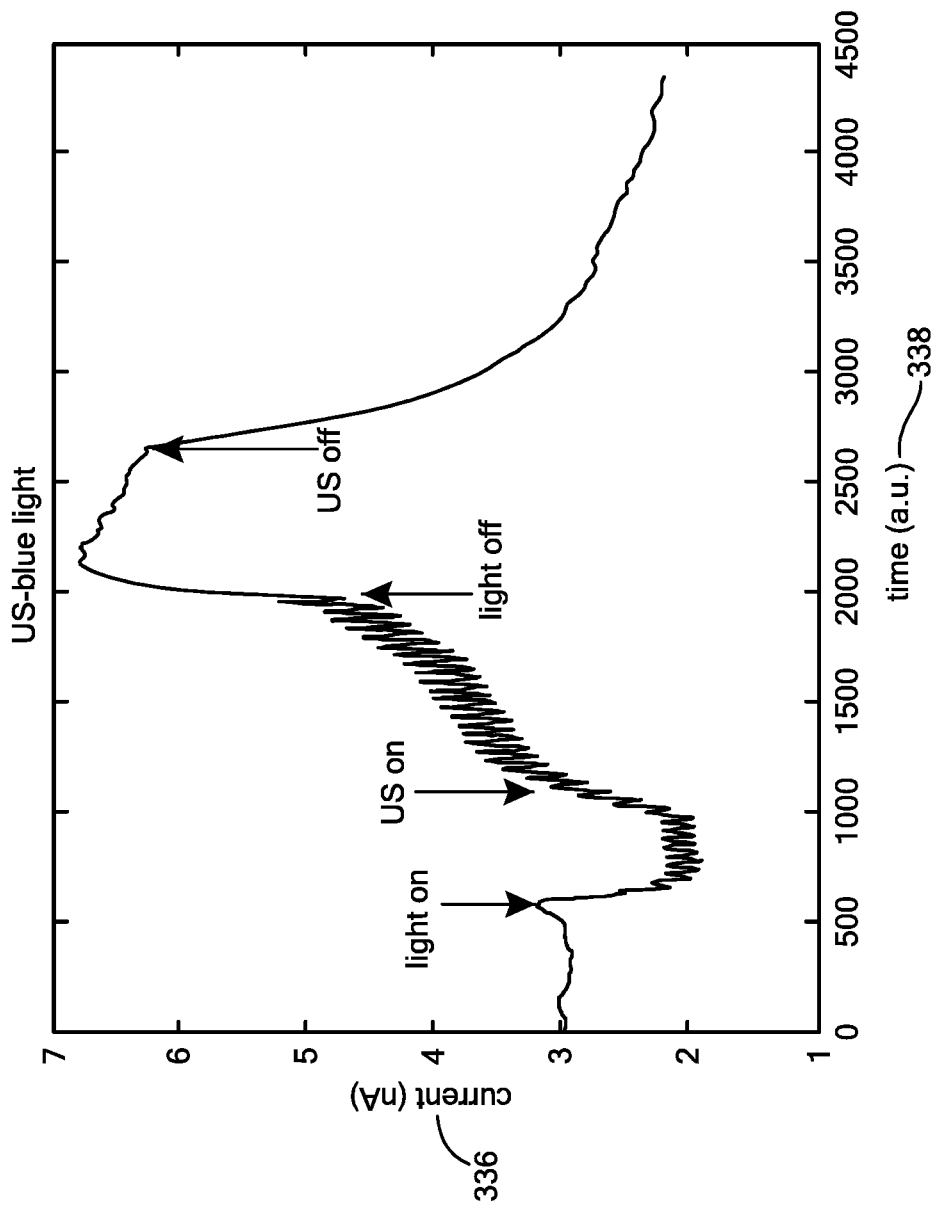
FIG. 3 is a plot of a cross-modal sensor output current vs. time; according to inputs received at the terminals of a cross-modal sensor, according to an example embodiment.

Referring now to FIG. 3, a plot representing the modulation of an output current (in nanoamps) 336 according to the signals generated at the terminals of cross-modal sensor 104 over time (in arbitrary units) 338 is provided.

Between 0-500 arbitrary units on the plot, no inputs have been received at the terminals of the cross-modal sensor 104 and therefore the output current 336 has not been modulated. Between 500-1000 arbitrary units on the plot, a first input including light radiation is received at material 234. In embodiments, material 234 may be a radiation absorbing material. As a signal representative of the first input is generated at the terminals, the output current 336 is changed according to the generated signal representative of the first input. Between 1000-2000 arbitrary units on the plot, a second input including an AC voltage provided from an ultrasound transducer is received by at least one terminal of cross-modal sensor 104. As the second input is received and an AC voltage is generated at the at least one terminal, the output current 336 is further modulated according to the AC voltage.

Between 2000 and 300 arbitrary units on the plot, the first input ceases to be received by the one or more terminals of cross-modal sensor 104. As the first input ceases to be received, the output current 336 is only modulated by the AC voltage of the second input. Between 3000 and 4500 arbitrary units, the second input ceases to be received by the one or more terminals of cross-modal sensor 104. As the second input ceases to be received, the output current 336 returns to its unmodulated state.

Figure 4:
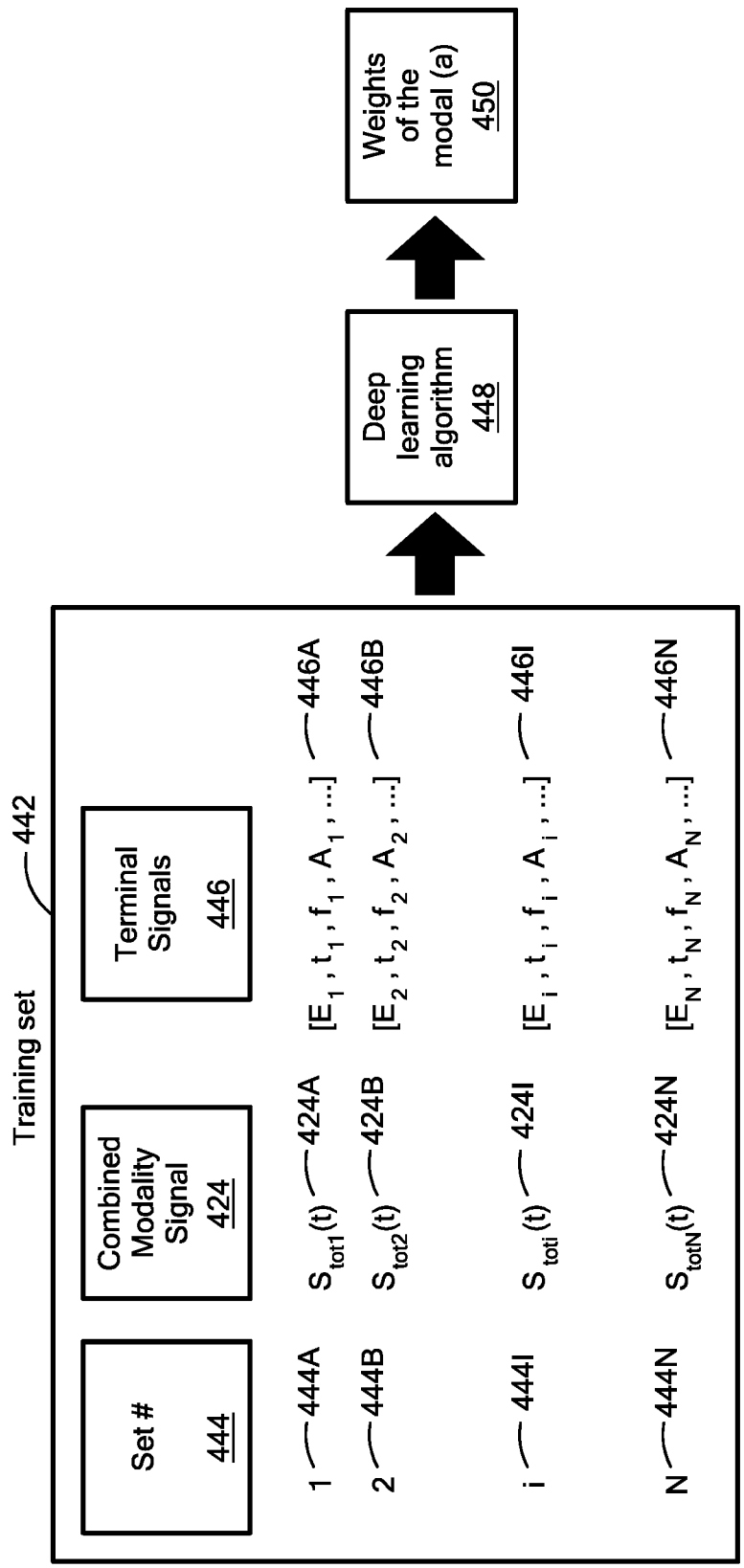
FIG. 4 is a signal flow diagram for utilizing a deep learning system to generate a set of weights for a model to process combined modality signals generated by a sensor such as the sensor or FIG. 1.

Referring now to FIG. 4, an example training set 442 is shown. In general overview, the training set 442 has two parts, namely the input examples (here generally denoted by reference numeral 424) and the output labels (here denoted by reference numeral 446). As illustrated in FIG. 4, each input example 424 is a cross-modal signal (measured or simulated). For each input example 424a-424N there exists two or more output labels (one for each modality) 446a-446N each of which is a vector containing information about each modality. The vector may represent the full signal or may represent information such as energy (E), time (t), frequency (f), amplitude (A) associated with the signal.

In the illustrative embodiment of FIG. 4, training set 442 comprises a plurality of known data sets 444a-444N (collectively referred to as "data sets 444"). Each data set 444a-444N corresponds to an example comprised of one or more cross-modal output signals (also referred to as combined modality signals) 424a-424N. The cross-modal output signals 424a-424N are generated from a known combination of two or more signals generated by different sensing modalities. For example, signal 424a may be resultant from a combination of a known MRI signal measurement of a tumor (i.e. an MRI signal measurement for which all significant characteristics are known) and a known PET signal of the same tumor (i.e. a PET signal for which all significant characteristics are known). Detailed information (i.e. signal characteristics including, but not limited to, frequency, amplitude, maximum values, minimum values, mean values, rms values, phase, relative amplitude and phase values, energy values, power values) is known a priori about the signals of each modality which make up each of the cross-modal signals in the training data set. The signals may be any type of signal including, but not limited to, analog signals, discrete time signals or digital signals including, but not limited to, voltage signals, current signals, magnetic field signals or electromagnetic waves.

The input examples thus correspond to one or more known signal sets 444. It should be appreciated that some signal sets 444 may be provided from empirical (i.e. measured) data while other signal sets may be provided from simulated data. Also, some signal sets may have some portions thereof provided from empirical data while and other portions thereof are provided from simulated data. Thus, training set 442 stored in memory can be provided from measured data, from simulated data or may be a combination of measured and simulated date (e.g. measured data augmented by signals that have been generated through computer simulations and not through an actual measurement made via a cross-modal interface).

The training data set 442 may be stored in a memory and utilized by a machine learning algorithm (e.g. a deep-learning algorithm) 448.

Based upon the training sets, learning algorithm 448 produces a set of probabilities (e.g. weights) which are applied to a model used to infer or predict an appropriate output signal based upon two or more unknown input signals applied to a multi-modal sensor such as the sensors described above in conjunction with FIGS. 1-2D. Such a model is executed or otherwise applied via a processor such as the modality derivation system described above in conjunction with FIG. 1. One of ordinary skill in the art will appreciate that deep-learning algorithm 448 can produce these weights 450 using deep-learning algorithms known in the art. Recurrent neural networks, convolutional neural networks as well as non-deep learning machine learning techniques such as support vector machines may also be used.

Figure 5:
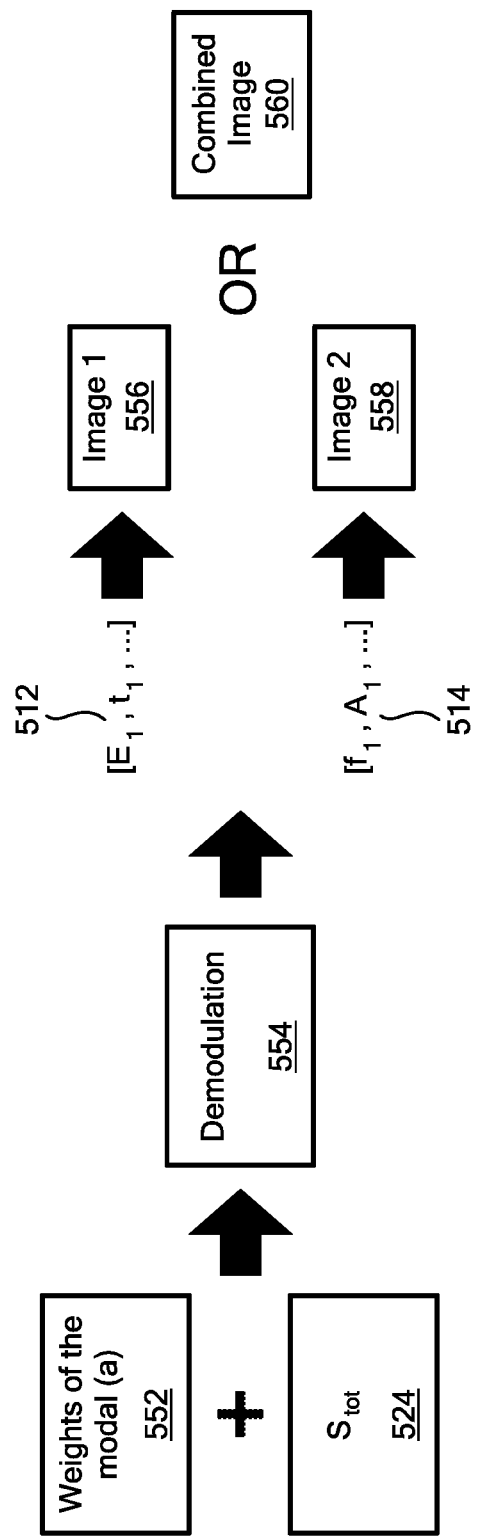
FIG. 5 is a signal flow diagram for generating output information from a plurality of signals each provided from different sensory modalities.

Referring now to FIG. 5, as illustrated in FIG. 5, a model 552 having probability values developed via a machine learning algorithm as discussed above is applied to an unknown multi-modal signal 524. The model performs a demodulation 554 meaning that via the model, the unknown multi-modal signal 524 can be separated into respective components 512, 514 which can be used to produce one or more signals 556, 558, 560 representative of the inputs received by cross-modal sensor.

For example, a cross-modal interface (e.g. cross-modal interface 102 described above in conjunction with FIG. 1) can be responsive to a first input associated with x-rays and a second input associated with magnetic resonance (such as that provided by an MRI coil) to generate combined modality signal 524. The combined modality signal 524 is processed to produce output 560 having information from both the first input (x-rays) and the second input (magnetic resonance), and/or outputs 556, 558 with one output (e.g. output 556) having information from the first input (x-rays) and one output (e.g. output 558) having information from the second input (magnetic resonance).

Figure 6:
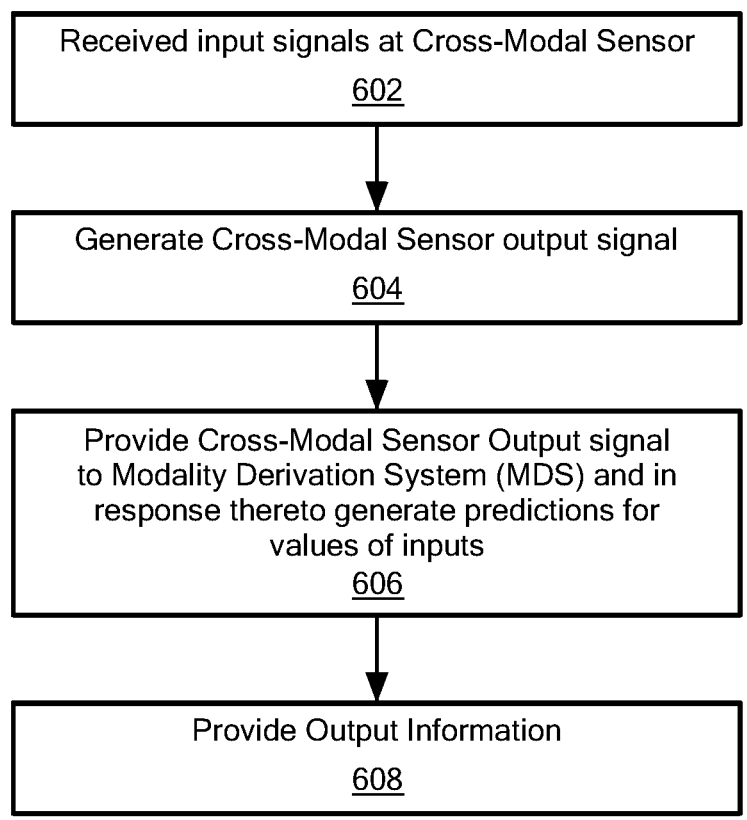
FIG. 6 is a flow diagram for processing performed by a cross-modal interfacing provided in accordance with the concepts described herein.

Referring now to FIG. 6, a technique for generating an output from two or more input signals concurrently received at a cross-modal sensor begins as shown in processing block 602 in which multiple input signals are received by a cross-modal interface which may be the same as or similar to any of the cross-modal interfaces described herein above in conjunction with FIGS. 1-5. At least two of the multiple input signals are generated by different modalities. For example, a first input signal may be generated via an x-ray system and a second input signal may be generated via an MRI system. In embodiments, the input signals are either applied at an input terminal (e.g. a gate terminal of a FET) or induced through absorption of radiation in a radiation sensitive material.

Each of the input signals may be concurrently received via a cross-modal sensor in the manner described above in conjunction with FIGS. 1-5.

Processing then proceeds to processing block 604, in which the cross-modal sensor generates a single signal (a so-called cross-modal signal) representative of the received input signals provided thereto. In embodiments, the cross-modal signal is generated between drain and source terminals of a FET. as discussed above with reference to FIGS. 1 and 2A-D.

Processing then proceeds to processing block 606 in which the cross-modal signal is processed via a processing utilizing a model having weights obtained from a machine learning system (e.g. a deep learning system) using at least one training set as discussed above with reference to FIGS. 4 and 5.

Processing then proceeds to processing block 608, at which an output is provided. Significantly, the output comprises information resultant from each of the different modalities (e.g. each from a plurality of different imaging modalities such as X-ray, MRI, PET, CT, etc. . . . ) from which the input signals are provided. In some embodiments, the technique concurrently receives input signals from multiple, different imaging modalities and provides a single output comprising information from each of the different imaging modalities.

Figure 7A:
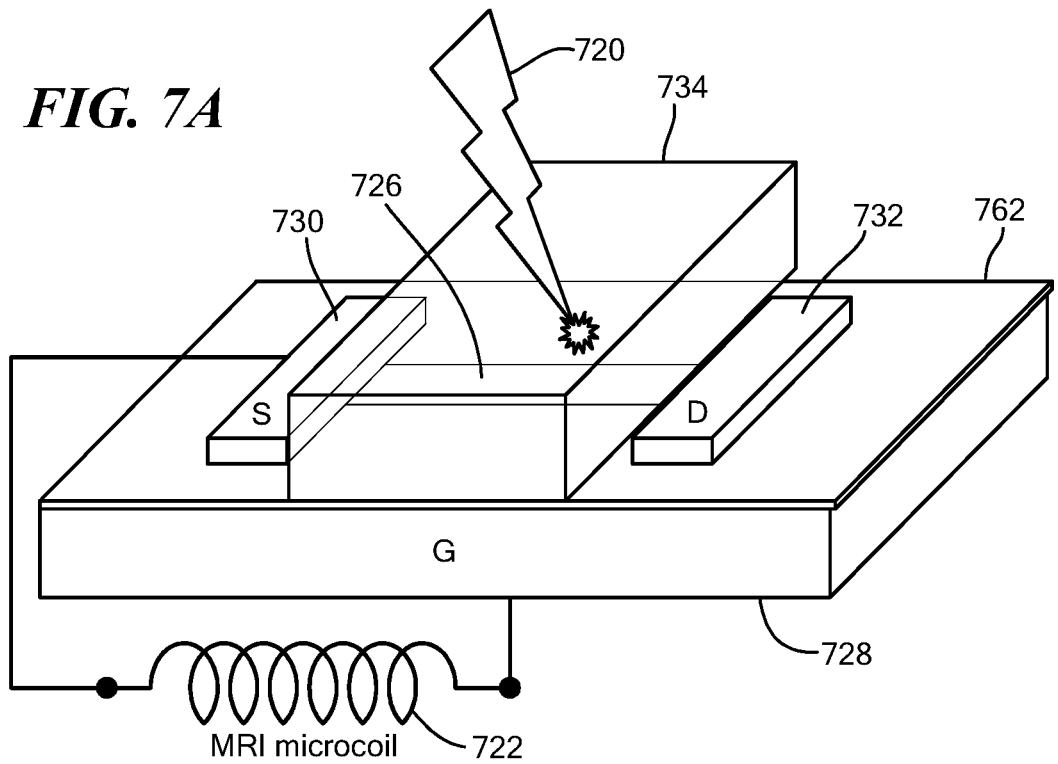
FIG. 7A is an isometric view for an example embodiment of a cross-modal sensor, according to some embodiments.

Referring now to FIG. 7A, an example embodiment of an integrated cross-modal sensor is provided. The cross-modal sensor may be the same or similar to cross-modal sensor 104 (FIG. 1) and is here disposed or otherwise provided on a substrate 762 having two opposing surfaces.

Cross-modal sensor includes a FET network disposed on a surface of substrate 762. FET network may be the same as or similar to the FET networks discussed above with reference to FIGS. 2A-D. In embodiments, FET networks can be disposed in multiple 3D layers of substrate 762 and includes a source (S) 730, drain (D) 732, a nanowire 726 disposed on the a first (e.g. top) surface of substrate 762, and a backside gate 728 disposed on substrate surface 762. The FET network may also include a frontside gate (not shown in FIG. 7A). A radiation sensitive layer 734 which may be similar to or the same as the radiation sensitive layer discussed with reference to FIGS. 2A-D is disposed over at least a portion of the frontside gate 726. It should be appreciated that the radiation sensitive layer could be disposed anywhere around the NW network (top, bottom, sides), therefore substrate 762 can also be comprised of a radiation sensitive layer. In embodiments, the radiation sensitive layer 734 is responsive to a first input 720 representative of a first imaging modality, such as light or x-rays.

Further, a second input 722 is coupled to the backside gate 728. In embodiments, the second input 722 is associated with a second modality (such as magnetic resonance) and is provided by an MRI coil. In embodiments, a current between source S 730 and drain D 732 of the FET network is modulated by radiation absorbed via the radiation sensitive layer 734 and a signal provided by an MRI coil 722 to the backside gate 728 as discussed above with reference to FIGS. 1 and 2A-D. Thus, with this illustrative embodiment, a cross-modal sensor capable of concurrently sensing radiation and signals provided from an MRI microcoil is provided.

Figure 7B:
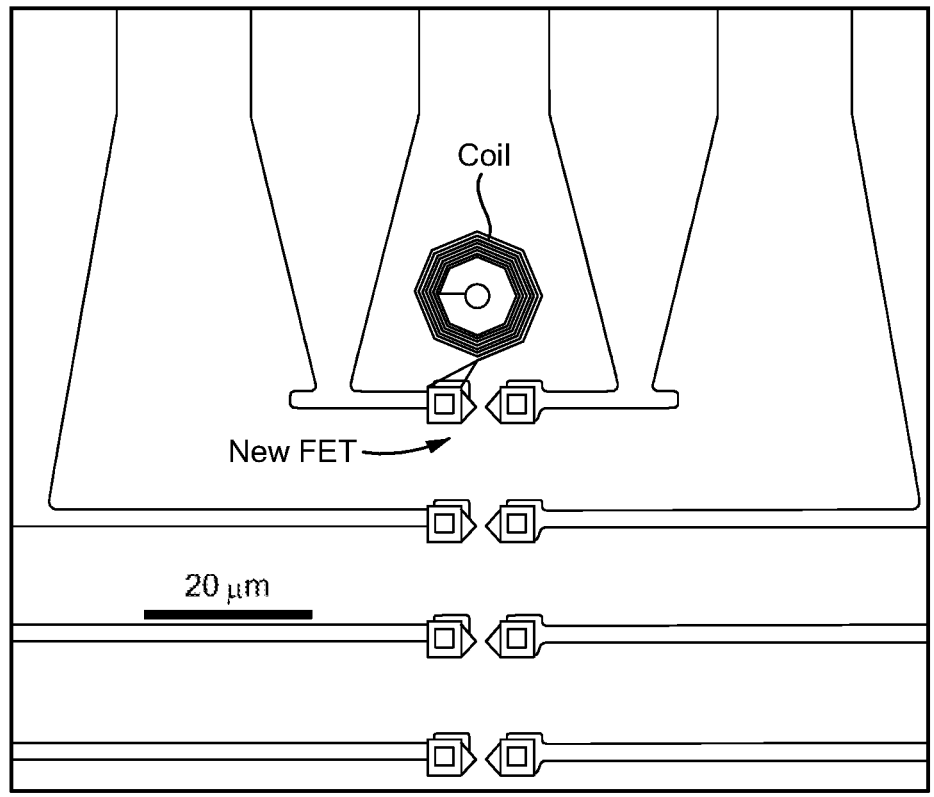
FIG. 7B is a plan view for an example embodiment of a cross-modal sensor, according to some embodiments.

Referring now to FIG. 7B, an example embodiment for the fabrication of a cross-modal sensor is provided. In the illustrative embodiment of FIG. 7B, a cross-modal sensor similar or the same to cross-modal sensor 104 is provided on a substrate. The cross-modal sensor of FIG. 7B includes a coil coupled to a gate of an NWFET. FIG. 7B includes a 20 µm scale for reference purposes.

FIG. 7B illustrates an embodiment in which the cross-modal interface is fully integrated with the sources of input signals. In particular, as illustrated in FIG. 7B, the cross-modal interface may be fabricated on the same substrate as MRI coils or as piezoelectric elements.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit).

Having described exemplary embodiments, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

The invention claimed is:

1. A cross-modal interface comprising:
a substrate;
at least one sensor having source and drain terminals, a frontside gate terminal, and a backside gate terminal disposed on the substrate, said sensor comprising a radiation sensitive material disposed about at least portions of the substrate and coupled to at least one of the source, drain, frontside gate, and backside gate terminals, the sensor responsive to a first input associated with a first imaging modality received at one of the frontside and backside gate terminals and a second input associated with a second imaging modality received via the radiation sensitive material; and
wherein the at least one sensor is configured such that a conductivity characteristic between the source and drain terminals changes in response to the first input associated with the first imaging modality received at the frontside or backside gate and the second input associated with the second imaging modality received via the radiation sensitive material such that the cross-modal interface generates a cross-modal interface signal representative of the first input associated with the first imaging modality received at the frontside or backside gate and the second input associated with the second modality received via the radiation sensitive material.

2. The cross-modal interface of claim 1, further comprising a modality derivation system coupled to the sensor so as to receive the cross-modal signal.

3. The cross-modal interface of claim 1, further comprising a voltage source configured to provide a voltage to at least one of the frontside gate terminal and the backside gate terminal.

4. The cross-modal interface of claim 1 wherein the detector element of the second modality is integrated into the cross-modal interface.

5. The cross-modal interface of claim 1 wherein the detector element of the second modality is integrated into the cross-modal interface via one of a micro-fabrication technique or a nano-fabrication technique.

6. The cross-modal interface of claim 1 wherein the first input is configured to accept a radiation signal associated with the first imaging modality and the second input is configured to accept a voltage associated with the second imaging modality.

7. A method for cross-modal signal generation comprising:
receiving, at a frontside gate terminal of a sensor a first input associated with a first imaging modality;
receiving a second input associated with a second imaging modality at a backside gate terminal of the sensor;
generating an output signal representative of the first input associated with the first imaging modality received at the frontside gate and the second input associated with the second imaging modality received at the backside gate.

8. The method of claim 7 wherein the first modality gating occurs via the absorption of a radiation by a radiation sensitive material.

9. The method of claim 7 wherein the second modality gating occurs by applying a bias signal to at least one the back-side gate terminal.

10. The method of claim 9 wherein the second modality gating occurs by applying at least one of a voltage or current bias signal to the back-side gate terminal.

11. The method of claim 10 wherein the at least one voltage or current bias signal is generated by a detector element specific to the second modality.

12. The method of claim 10 wherein the at least one voltage or current bias signal is generated by a piezoelectric transducer for an ultrasound modality or a coil for an MRI modality.

13. The method of claim 7 further comprising demodulating the output signal into an image representative of the first input associated with the first imaging modality and the second input associated with second imaging modality.

14. The method of claim 7 wherein generating an output signal representative of the first input associated with the first imaging modality received at the frontside gate and the second input associated with the second imaging modality received at the backside gate comprises modulating a current between a source terminal and a drain terminal of the sensor according to the first input associated with a first imaging modality received at the frontside gate terminal of the sensor and the second input associated with the second imaging modality received at the backside gate terminal of the sensor.

15. The method of claim 7 further comprising generating, at the frontside gate terminal of the sensor, a signal representative of the first input associated with the first imaging modality.

16. A cross-modal interface for one or more imaging modalities comprises:
at least one sensor provided from a plurality of field effect transistors (FETs), each of the FETs having source and drain terminals and at least one gate terminal;
a radiation sensitive material disposed to be coupled to at least one of the FET terminals, the sensor responsive to a first input associated with a first imaging modality received at the at least one gate terminal and further responsive to a second input associated with a second imaging modality received at the radiation sensitive material wherein the sensor is configured so that the conductivity between the source and drain terminals changes in response to either the first input associated with the first imaging modality or the second input associated with the second imaging modality.

17. The cross-modal interface of claim 16 wherein in response to the plurality of input signals provided thereto, the sensor generates a single output signal corresponding to a combined modality signal representative of the first input associated with the first imaging modality and the second input associated with the second modality.

18. The cross-modal interface of claim 17 further comprising a processor configured to receive a combined modality signal from the sensor and process the received combined modality signal provided thereto in accordance with the learned training data set and configured to generate information associated with the multiple signals of different modalities detected by the sensor.

19. The cross-modal interface of claim 18 wherein at least one of the at least one sensors comprises a nanowire FET.

20. The cross-modal interface of claim 18 wherein the processor is configured to derive the first and second modality signal from any arbitrary cross-modal signal via a learning algorithm exposed to a training data set wherein the training data set comprises a plurality of cross-modal signals with the cross-modal signals comprising signals of each modality which may be sensed by the senor and wherein detailed signal characteristics are known apriori about the signals of each modality in the training data set.

* * * * *